(12) United States Patent
Schwarzenbach

(10) Patent No.: US 11,476,153 B2
(45) Date of Patent: Oct. 18, 2022

(54) METHOD FOR PRODUCING AN ADVANCED SUBSTRATE FOR HYBRID INTEGRATION

(71) Applicant: Soitec, Bernin (FR)

(72) Inventor: Walter Schwarzenbach, Saint Nazaire les Eymes (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 17/276,107

(22) PCT Filed: Sep. 11, 2019

(86) PCT No.: PCT/EP2019/074276
§ 371 (c)(1),
(2) Date: Mar. 12, 2021

(87) PCT Pub. No.: WO2020/053306
PCT Pub. Date: Mar. 19, 2020

(65) Prior Publication Data
US 2022/0051934 A1    Feb. 17, 2022

(30) Foreign Application Priority Data

Sep. 14, 2018  (FR) ...................... 1800972

(51) Int. Cl.
*H01L 21/762* (2006.01)
*H01L 27/12* (2006.01)
(Continued)

(52) U.S. Cl.
CPC ........ *H01L 21/76254* (2013.01); *H01L 21/84* (2013.01); *H01L 27/1207* (2013.01); *H01L 21/02532* (2013.01)

(58) Field of Classification Search
CPC ........... H01L 21/76254; H01L 27/1207; H01L 21/84; H01L 21/02532; H01L 21/0262; H01L 21/02639; H01L 21/02381
(Continued)

(56) References Cited

U.S. PATENT DOCUMENTS 6,060,344 A    5/2000  Matsui et al.
8,355,126 B2   1/2013  Goulter et al.
(Continued)

FOREIGN PATENT DOCUMENTS

FR        3086096 B1       8/2021
WO    2020/053306 A1       3/2020

OTHER PUBLICATIONS

French Office Action for Application No. 1800972 dated Jan. 28, 2019, 2 pages.
(Continued)

*Primary Examiner* — Thinh T Nguyen
(74) *Attorney, Agent, or Firm* — TraskBritt

(57) ABSTRACT

A method of forming a substrate comprises providing a receiver substrate and a donor substrate successively comprising: a carrier substrate, a sacrificial layer, which can be selectively etched in relation to an active layer, and a silicon oxide layer, which is arranged on the active layer. A cavity is formed in the oxide layer to form a first portion that has a first thickness and a second portion that has a second thickness greater than the first thickness. The cavity is filled with a polycrystalline silicon filling layer to form a second free surface that is continuous and substantially planar. The receiver substrate and the donor substrate are assembled at the second free surface, and the carrier substrate is eliminated while preserving the active layer and the sacrificial layer.

12 Claims, 6 Drawing Sheets

(51) Int. Cl.
    *H01L 21/84*  (2006.01)
    *H01L 21/02*  (2006.01)
(58) Field of Classification Search
    USPC .......................... 438/149, 479, 517; 257/347
    See application file for complete search history.

(56) References Cited

U.S. PATENT DOCUMENTS

| | | | |
|---|---|---|---|
| 2004/0259334 A1* | 12/2004 | Bedell et al. | H01L 21/26506 438/407 |
| 2007/0200144 A1 | 8/2007 | Aspar et al. | |
| 2008/0036039 A1 | 6/2008 | Aspar | |

OTHER PUBLICATIONS

French Search Report and Written Opinion from French Application No. 1800972, dated May 9, 2019, 16 Pages with English translation.
International Search Report for International Application No. PCT/PCT/EP2019/074276 dated Oct. 28, 2019, 2 pages.
International Written Opinion for International Application No. PCT/PCT/EP2019/074276 dated Oct. 28, 2019, 18 pages with translation.
Nguyen et al., Transistors on Hybrid UTBB/Bulk Substrates Fabricated by Local Internal BOX Dissolution, Solid-State Electronics, vol. 90, (Dec. 2013), pp. 39-43 (abstract only).

* cited by examiner

METHOD FOR PRODUCING AN ADVANCED SUBSTRATE FOR HYBRID INTEGRATION

CROSS-REFERENCE TO RELATED APPLICATIONS

This application is a national phase entry under 35 U.S.C. § 371 of International Patent Application PCT/EP2019/074276, filed Sep. 11, 2019, designating the United States of America and published as International Patent Publication WO 2020/053306 A1 on Mar. 19, 2020, which claims the benefit under Article 8 of the Patent Cooperation Treaty to French Patent Application Ser. No. 18/00972, filed Sep. 14, 2018.

TECHNICAL FIELD

The present disclosure relates to the field of producing semiconductor components of SOI (abbreviation of Silicon on Insulator) type, and, in particular, the field of producing advanced substrates for hybrid integration of components configured for different applications or functionalities.

BACKGROUND

An SOI structure typically comprises an active layer of silicon, in which the components themselves are located, and under which is placed a buried silicon oxide layer. The latter constitutes an insulation with respect to parasitic currents and charges originating from ionized particles. It also allows good insulation of neighboring components produced in the same silicon layer, and, in particular, a significant reduction in the parasitic capacitances between such neighboring components. It rests, itself, on a silicon substrate, which acts as a mechanical carrier.

This type of substrate is generally produced by the SMART CUT™ process, which comprises the following steps:
providing a carrier substrate,
providing a single-crystal silicon donor substrate,
forming a weakened zone in the donor substrate to define therein the future active layer (the weakened zone may be formed by implantation of atomic species at a defined depth in the donor substrate),
bonding the first donor substrate on the carrier substrate, after having formed an oxide layer on the carrier substrate or on the donor substrate or both, the oxide layer being intended to form the buried oxide layer,
detaching the first donor substrate along the weakened zone, resulting in the transfer of the active layer to the carrier substrate,
carrying out a finishing treatment on the transferred layer to repair or remove the defects linked to the detachment step and to confer on the layer the optimal roughness and thickness characteristics to obtain the final substrate of SOI type on which the intended components will be integrated.

The finishing treatment usually comprises either thermal treatments intended to correct the defaults resulting from the implantation and detachment process, completed by chemical mechanical polishing intended to improve the roughness of the surface of the transferred layer while at the same time contributing to bringing its thickness to the targeted value, or thermal treatments intended to bring the thickness of the transferred layer to a target thickness, completed by additional thermal treatments carried out at high temperatures, typically above 1100° C., intended to smooth the surface of the active layer by thermally activated diffusion of the silicon atoms.

In general, the transferred silicon active layer typically has a thickness ranging from a few nanometers to several hundred nanometers, while the buried oxide layer has a thickness ranging from about ten nanometers to several hundred nanometers (typically 1000 nm) or more.

The thicknesses of the active layer and of the buried oxide layer generally vary according to the intended application. By way of example, the thickness of the silicon active layer is typically between approximately 3 and 40 nm, and that of the buried oxide layer is typically between approximately 10 and 40 nm, for substrates intended for the production of SOI components of FD (Fully Depleted) type. Moreover, for substrates configured for producing SOI components of RF (radiofrequency) type, the thicknesses of the active silicon layer and of the buried oxide layer are typically greater than approximately 50 nm.

Indeed, various thicknesses of the buried silicon oxide layer make it possible to obtain different degrees of insulation, different leakage currents, different voltage strengths, different equivalent capacitances, as many parameters as the developer chooses. In addition, one or more functional layers can be interposed between the buried oxide layer and the silicon carrier substrate. The objective of this type of layer arrangement is to limit the self-bias and the crosstalk between the components, conveyed via the substrate, in particular, those induced by the strong electromagnetic radiation of the radiofrequency components.

As a result, for certain applications or functions, it will be preferred to instead select substrates of SOI type having a fine buried silicon oxide layer, for example, for producing transistors of FDSOI type; for other applications, substrates of SOI type having a thick buried silicon oxide layer and/or having a functional additional layer will be preferred for producing, for example, power components or radiofrequency components.

Moreover, due to the very fact of the industrial fabrication processes known to those skilled in the art, the vast majority of substrates of SOI type are "homogeneous," in other words, the thicknesses of the buried oxide layer and of the active layer are constant over the entire substrate.

However, attempts to produce components by alternating zones of "bulk" type and of SOI type on the same substrate are known.

The article "Transistors on hybrid UTBB/Bulk substrates fabricated by local internal BOX dissolution" by P. Nguyen et al., and published in "Solid State Electronics, Vol. 90, pp 39-43, 2013," describes the production of CMOS components on a hybrid SOI/bulk substrate obtained by local internal dissolution of the buried oxide layer. However, this technique suffers from two major problems for industrial use.

Indeed, the dissolution process creates a poorly controlled transition between the portions of the buried oxide layer that have different thicknesses. The zones of transitions between the portions are long (about a few μm at best, because of the dissolution process used) and are thus incompatible with a large-scale co-integration.

Furthermore, for a dissolved oxide layer thickness of about ten nm, the dissolution process generates considerable non-uniformity of the buried oxide layer and subsequently of the active layer on insulator. This non-uniformity is responsible for a mismatch of the electrical behavior between the zones of the buried oxide layer that have different thicknesses, which is detrimental to the correct functioning of the various components produced on hybrid substrates of this type.

BRIEF SUMMARY

There is currently a need to provide a "monolithic" substrate of SOI type, which has an electrically insulating buried layer (or an active layer) comprising at least two zones that have different thicknesses, while at the same time guaranteeing:
- a uniformity of the thicknesses of the various portions of the layers,
- an optimal roughness, and
- an abrupt transition between the various portions of the layers that have different thicknesses, which are compatible with the specifications of a large-scale integration of various types of components on the monolithic substrate, comprising, for example, components of FDSOI type.

There is also a need to provide a process for producing substrates having the abovementioned specifications, which is easy to implement, and compatible with specific donor and/or receiver substrates, for example, comprising trapping layers of "Trap Rich" type or doped layers. Indeed, substrates of this type require limited finishing thermal budgets, in particular, for smoothing the surface of the active layer on insulator (processes of "Rapid Thermal Annealing" type, as opposed to "Thermal Batch Annealing" type).

These needs are increasingly significant, in particular, in the field of systems on chip or SOC, which integrate several functions on one the same chip, or in the field of the co-integration of digital components and of radiofrequency components, or else in the field of microsystems integrating, for example, sensors or accelerometers along with read-out circuits.

These needs may be satisfied while at the same time avoiding the abovementioned drawbacks, by providing a process for producing an advanced substrate, comprising the following steps:
a) Providing a receiver substrate and a donor substrate comprising:
  A carrier substrate;
  An active layer made from a single-crystal semiconductor material; and
  A sacrificial layer made from a material that can be selectively etched with respect to the active layer, the sacrificial layer being interposed between the carrier substrate and the active layer;
  A silicon oxide layer with a free surface and arranged so that the active layer is interposed between the sacrificial layer and the oxide layer;
b) Forming a cavity in the oxide layer, the cavity having an opening that lies flush with the free surface so that the oxide layer comprises a first portion having a first thickness e1 and placed between the cavity and the active layer, and a second portion having a second thickness e2 greater than the first thickness e1, the second portion being placed between the free surface and the active layer;
c) Forming a polycrystalline silicon filling layer so as to completely fill the cavity and form a continuous and substantially planar second free surface, comprising at least one first polycrystalline silicon surface;
d) Assembling the receiver substrate and the donor substrate on the second free surface;
e) Removing the carrier substrate after step d) while preserving the active layer and the sacrificial layer.

According to one embodiment, the process can comprise a step of selectively etching the sacrificial layer while at the same time preserving the active layer, after step e). Moreover, the assembling step d) can comprise a step of bonding by molecular adhesion.

According to one embodiment, the process can also comprise the following steps:
  b0) Forming, before step b) and after step a), a weakened zone in the carrier substrate, the weakened zone being substantially planar and located in the vicinity of the interface between the sacrificial layer and the carrier substrate;
  e0) Fracturing the carrier substrate along the weakened zone, after step d).

Furthermore, the sacrificial layer can be made from a material that can be selectively etched with respect to the material of the carrier substrate. As a result, the remainder of the carrier substrate placed on the sacrificial layer can be selectively etched after the fracturing step e0). The filling layer can also be formed by chemical vapor deposition at a temperature between 150° C. and 250° C.

According to one embodiment, the single-crystal silicon active layer can be produced by epitaxy. Moreover, the active layer preserved after step e) can be locally thinned so as to locally reduce the thickness of the active layer.

According to one embodiment, the filling layer can cover the silicon oxide layer. Furthermore, an additional polycrystalline silicon layer can be formed on the second portion of the silicon oxide layer, the additional layer preferentially having a thickness e' of between 1 and 1000 nm, the second free surface formed following step c) being, in this case, entirely made from polycrystalline silicon.

Moreover, step c) can comprise thinning of the filling layer and/or of the oxide layer so that the second free surface also comprises a second silicon oxide surface.

Also provided is an advanced substrate comprising:
  A receiver substrate;
  An active layer made from single-crystal semiconductor material; and
  An electrically insulating silicon oxide layer interposed between the active layer and the receiver substrate;
  wherein it comprises a polycrystalline silicon layer placed on the receiver substrate, the polycrystalline silicon layer being coated with the electrically insulating layer so as to define a first portion of the electrically insulating layer having a first thickness e1 and interposed between the polycrystalline silicon layer and the active layer, and a second portion of the electrically insulating layer having a second thickness e2 greater than the first thickness e1, the second portion being placed between the receiver substrate and the active layer.

According to one embodiment, the substrate comprises an additional layer made from polycrystalline silicon, interposed between the receiver substrate and the assembly formed by the electrically insulating layer and the polycrystalline silicon layer. The substrate can also comprise an additional electrically insulating layer interposed between the additional layer and the receiver substrate. Preferentially, the receiver substrate comprises: an epitaxially grown and doped layer, configured to form microelectronic components in the epitaxially grown layer. Moreover, the receiver substrate can comprise integrated circuits.

BRIEF DESCRIPTION OF THE DRAWINGS

Other features and advantages of the present disclosure will emerge from the detailed description that follows, with reference to the accompanying drawings in which.

To make the drawings clearer, the various layers have not necessarily been drawn to scale. Reference signs that are identical from one figure to the next have been used to reference elements that are identical or that perform the same function.

DETAILED DESCRIPTION

For the various embodiments, the same references will be used for elements that are identical, or which perform the same function, for the sake of simplifying the description.

FIGS. 1A to 1F schematically represent embodiments of a process according to the present disclosure. In order to facilitate the illustration, the respective thicknesses of the various layers are not shown to scale.

Figure 1A:
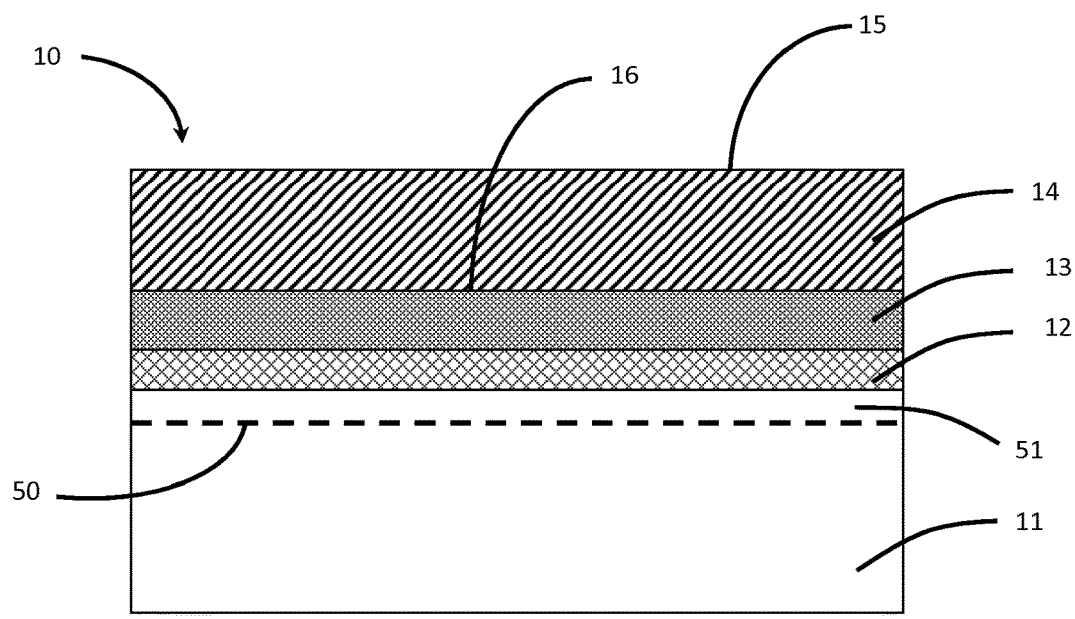
FIGS. 1A to 1F, including 1D' and 1F', represent schematic sectional views illustrating steps of a process for producing an advanced substrate according to various embodiments.
Figure 1B:
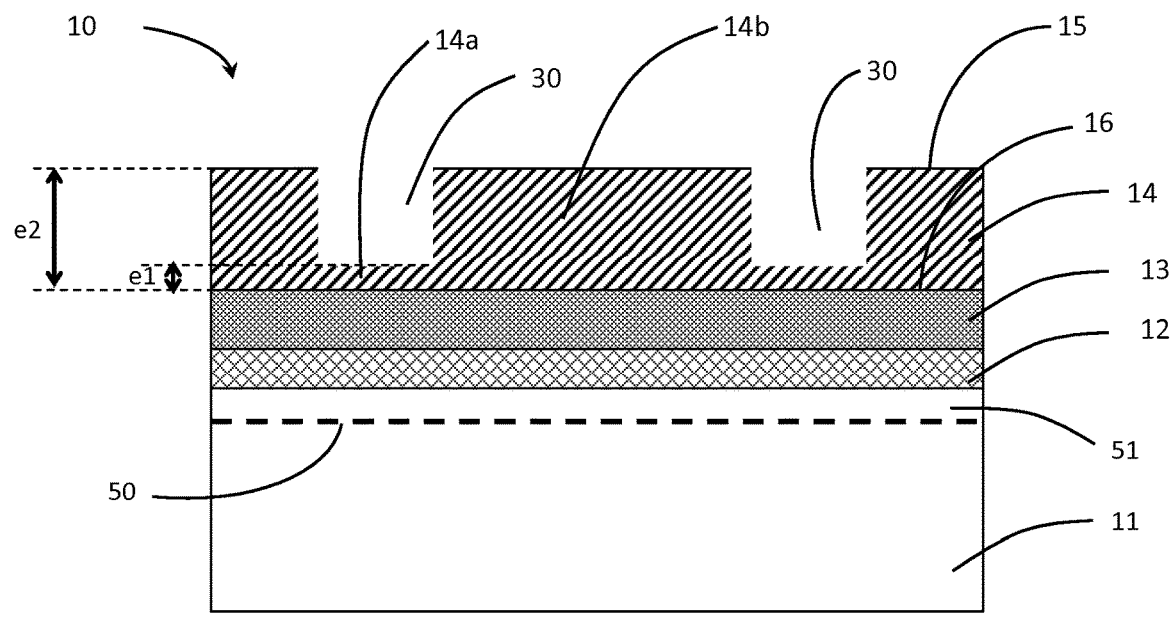
Figure 1C:
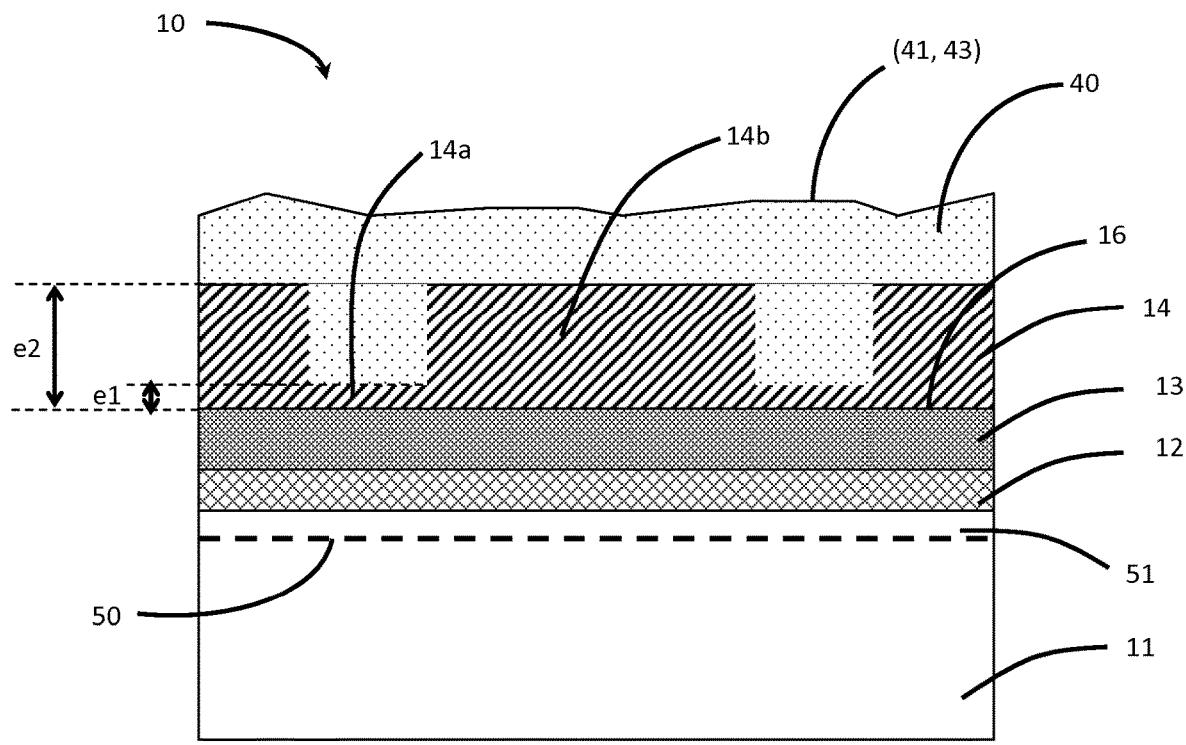
Figure 1D:
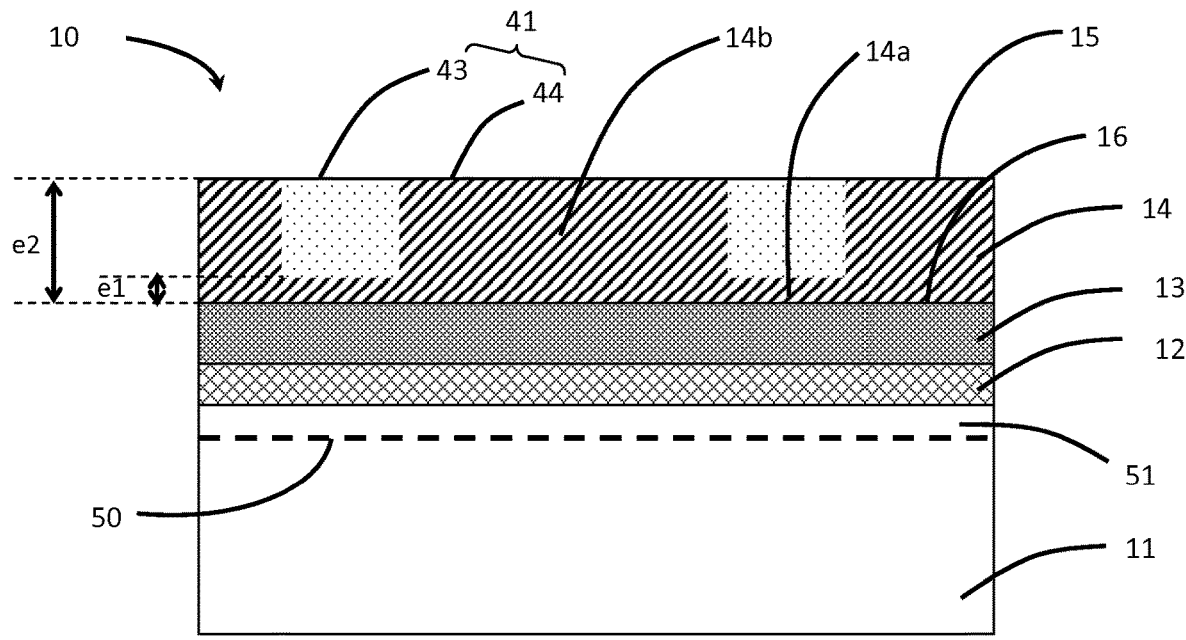
Figure 1D:
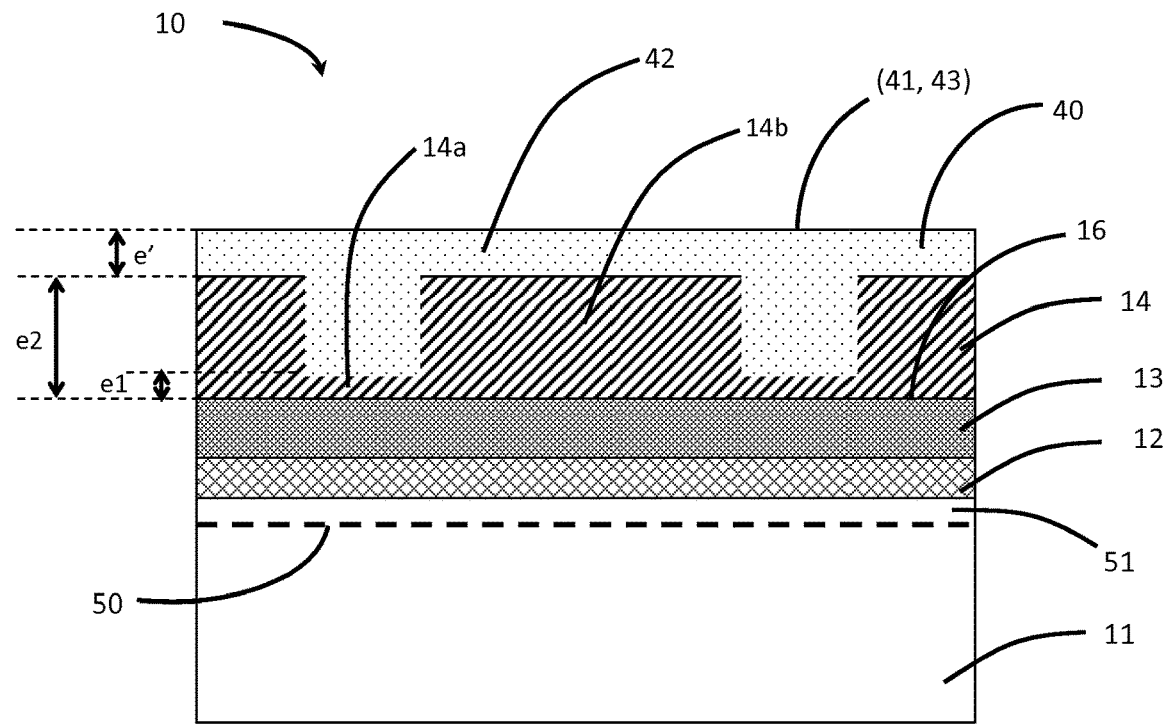
Figure 1E:
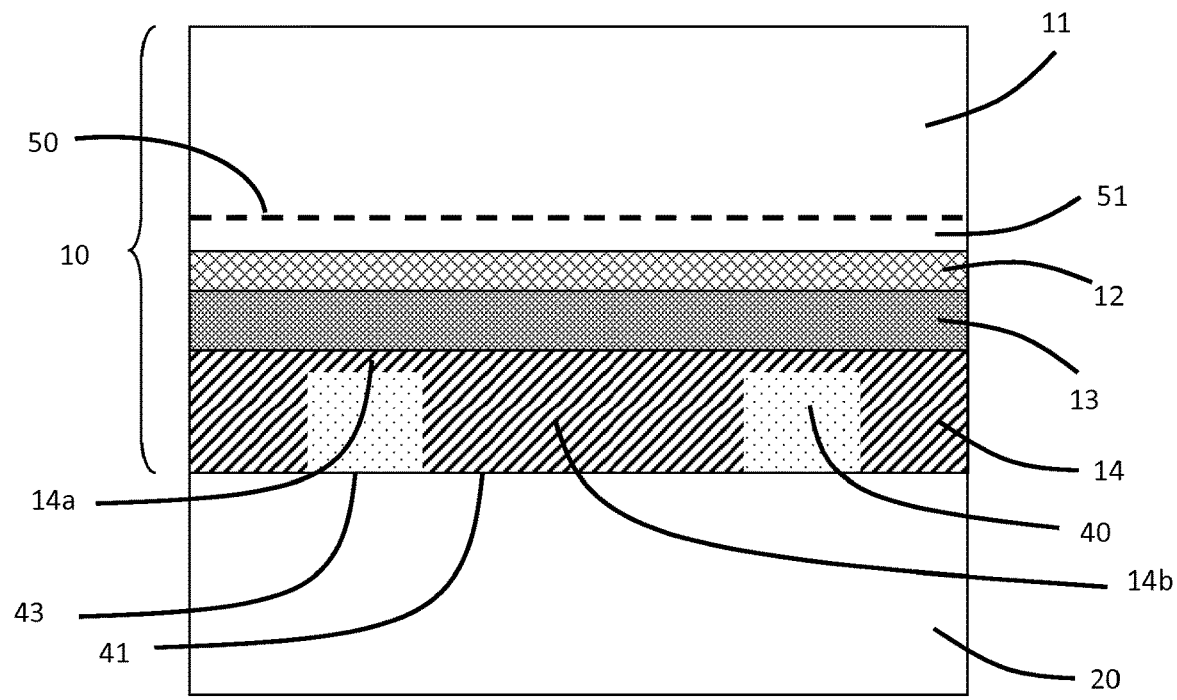
Figure 1F:
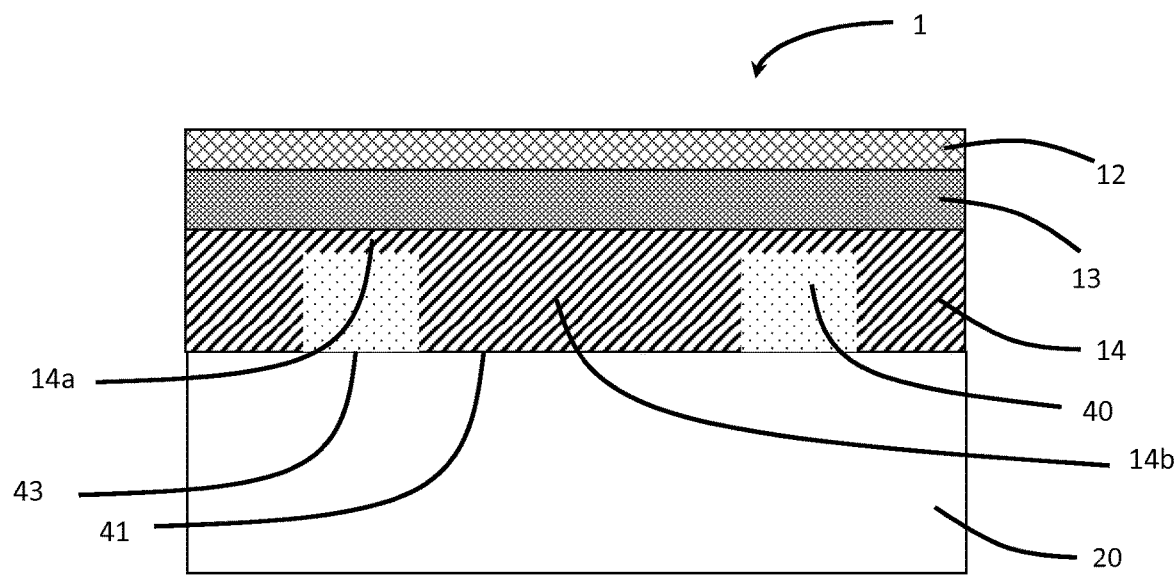
Figure 1F:
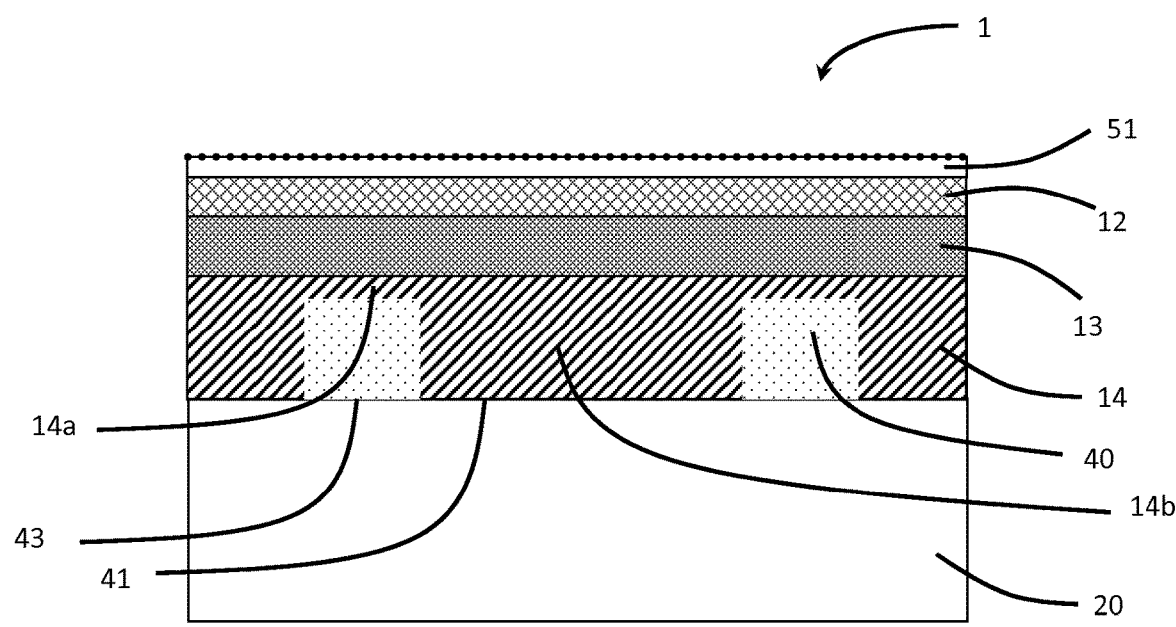

According to one embodiment, the process for producing an advanced substrate 1 comprises a step a) of providing a receiver substrate 20 (cf. FIGS. 1E, 1F and 1F'). The receiver substrate 20 may be made from a semiconductor material or from another material, depending on whether it must solely perform a mechanical carrier function or an electrical function within the final advanced substrate 1. Preferentially, the receiver substrate 20 is silicon based. Moreover, the receiver substrate 20 may comprise one or more functional additional layers, such as a trapping layer, termed "Trap Rich" layer, for example, based on polycrystalline silicon (optionally with a silicon oxide layer interposed between the receiver substrate 20 and the trapping layer), or else such as an epitaxially grown layer made from doped semiconductor material, etc.

As illustrated in FIG. 1A, this step also comprises a step of providing a donor substrate 10 comprising:
A carrier substrate 11;
An active layer 13 made from a single-crystal semiconductor material; and
A sacrificial layer 12 made from a material that can be selectively etched with respect to the active layer, the sacrificial layer 12 being interposed between the carrier substrate 11 and the active layer 13;
A silicon oxide layer 14 with a free surface 15 and arranged so that the active layer 13 is interposed between the sacrificial layer 12 and the oxide layer 14.

The carrier substrate 11 may be made from a semiconductor material or another material, given the expected crystal quality of the layers 12 and 13. Preferentially, the carrier substrate 11 is silicon based.

The active layer 13 is a layer configured to receive microelectronic components. In other words, the components will be formed in the active layer 13. Preferentially, the active layer 13 is made from single-crystal silicon, or from single-crystal silicon-germanium, which may be strained or relaxed.

According to one embodiment, the active layer 13 is advantageously formed by epitaxy. This is because a layer formed by epitaxy makes it possible to obtain a roughness, a uniformity of thickness and a surface finish of the layer that are optimal, in particular, compatible with the most demanding specifications of processes for producing microelectronic components, such as the process for producing components of FDSOI type.

Advantageously, the sacrificial layer 12 is also produced by epitaxy, in order to facilitate any epitaxy of the active layer 13. The sacrificial layer may be based on silicon and germanium, when the active layer is based on silicon or silicon-germanium. Moreover, the sacrificial layer 12 may also be based on any material that allows selective etching of the sacrificial layer 12 with respect to the active layer 13 as long as its crystal quality remains compatible with that required for the active layer 13.

Even more advantageously, the materials of the carrier substrate 11 and of the sacrificial layer 12 are configured so that the material of the carrier substrate 11 is selectively etched relative to the sacrificial layer 12 and so that the sacrificial layer 12 is selectively etched with respect to the active layer 13.

The oxide layer 14 can be produced by any technique known to those skilled in the art that is compatible with conventional processes in the microelectronics field. Preferentially, the oxide layer 14 is a usual thermal oxide.

The thickness of the carrier substrate 11 may be about a few hundred μm, typically 775 μm for substrates having a diameter of approximately 300 mm. The thickness of the sacrificial layer 12 depends on the etching solution and/or technique that are used. Those skilled in the art will know how to adjust its thickness so that it can be efficiently and selectively etched, with respect to the active layer 13. Advantageously, its thickness is also adjusted so that the material of the carrier substrate 11 can be selectively etched with respect to the sacrificial layer 12 while at the same time preserving the crystal properties of the active layer 13.

The thickness of the active layer 13 is preferentially between 5 and 500 nm, and the thickness of the oxide layer 14 is preferentially between 10 and 500 nm.

As illustrated in FIG. 1B, the process comprises a step b) of forming at least one cavity 30 in the silicon oxide layer 14. The cavity 30 is open, and comprises an opening flush with the free surface 15 of the oxide layer 14. The cavity 30 comprises walls. The walls of the cavity 30 and the opening of the cavity 30 delimit the volume of the cavity 30. Advantageously, the cavity 30 is not a through cavity and does not comprise an opening that is flush with the interface 16 between the oxide layer 14 and the active layer 13, so that the oxide layer 14 comprises a first portion 14a having a non-zero first thickness e1. The first portion 14a is between the cavity 30 and the active layer 13.

The oxide layer 14 thus comprises a second portion 14b having a second thickness e2 greater than the first thickness e1 of the first portion 14a. The second portion 14b is between the free surface 15 and the active layer 13.

For the sake of simplifying the figures, two cavities 30 have been shown, but it goes without saying that a donor substrate 10 can comprise in principle a high number of cavities extending parallel to one another. Preferentially, a network of cavities 30 is distributed in the oxide layer 14 so as to delimit several patterns defining the second portions 14b. In other words, each pattern forming the second portion 14b of the oxide layer 14 is delimited by the cavities 30.

The cavity or the cavity 30 network may be produced by any conventional technique. Advantageously, the cavity 30 can be produced by a succession of photolithography and etching steps, which are known and widely used in the microelectronics field. Thus, an abrupt transition between the various portions of the oxide layers having various thicknesses is advantageously obtained. This also guarantees a uniformity of the thicknesses of the layers, in particular, of the oxide layers.

After the formation of the cavity 30, the process comprises a step c) intended to form a cavity 30 filling layer. As illustrated in FIGS. 1C, 1D and 1D', the filling layer 40 is formed so as to completely fill the cavity 30 and form a second free surface 41, which is continuous and substantially planar, and which comprises at least one first surface 43 based on the filling material.

According to one embodiment, the filling layer 40 covers the silicon oxide layer 14.

Advantageously, the filling layer 40 is made from polycrystalline silicon. Polycrystalline silicon is a material that is easy to deposit on a silicon oxide layer. In addition, this material offers the possibility of deposition at low temperatures, which makes it compatible with a structure comprising an epitaxially grown, and/or implanted, donor substrate. Finally, the polycrystalline silicon may advantageously serve both as a conductive layer under a future thin buried oxide, defined, for example, in zone 14a, and as a trapping layer (commonly known as layer of "Trap Rich" type) in zone 14b while at the same time being compatible with bonding by molecular adhesion on the receiver substrate 20.

In addition, it is known that polycrystalline silicon has a better thermal conductivity than a silicon oxide. As a result, the use of a buried silicon oxide-based layer comprising layers of polycrystalline silicon, in combination with a silicon receiver substrate, advantageously makes possible a better dissipation of the heat, from the active zone to and in the receiver substrate.

Preferentially, step c) comprises a planarization or thinning step, configured to make the second free surface 41 substantially planar. The planarization step may comprise combined actions of mechanical and chemical forces, such as a chemical mechanical polishing process, commonly known as CMP process.

According to one embodiment illustrated in FIG. 1D, step c), in particular, the planarization step is carried out so as to totally remove the polycrystalline silicon covering the second portion 14b of the oxide layer 14. In other words, step c) comprises the step of planarization or thinning of the filling layer 40 and/or of the oxide layer 14 so that the second free surface 41 also comprises a second silicon oxide surface 44.

According to another embodiment illustrated in FIG. 1D', a polycrystalline silicon layer 42 is formed on the second portion 14b of the silicon oxide layer 14 and the filled cavity 30. Preferentially, the layer 42 has a thickness e' of between 1 and 1000 nm. According to this embodiment, the second free surface 41 formed subsequent to step c) is entirely made from polycrystalline silicon. The layer 42 may be formed, for example, by successively adjusting the thickness of the filling layer 40 formed, then the thickness removed from the filling layer 40, after the step of planarization or thinning of the polycrystalline silicon layer 40.

As a result, the advanced substrate 1 obtained (cf. an example final substrate obtained, illustrated in FIG. 3), will advantageously comprise a buried insulating layer comprising a thick layer 14b, which has a functional layer (trapping layer, commonly known as layer of "Trap Rich" type) interposed between the receiver substrate 20 and the buried insulating layer 14b and a thin oxide layer 14a. This type of substrate will offer a possibility of efficient co-integration of components of FDSOI type arranged on a thin buried insulator (first portion 14a), and radiofrequency components arranged on a thick buried insulator (second portion 14b and a polycrystalline silicon layer) while at the same time limiting the self-bias and the crosstalk between the components conveyed via the advanced substrate 1, in particular, those induced by the strong electromagnetic radiation of the radiofrequency components. This may be possible by virtue of the functional layer (layer 42) placed "under" the thick silicon oxide portion 14b.

Moreover, the process also comprises a step d) of assembling the receiver substrate 20 and the donor substrate 10 at the second free surface 41 (cf. FIG. 1E). Advantageously, the assembling step d) is carried out by molecular adhesion. The assembling is advantageously carried out by bringing the second free surface 41 of the donor substrate 10 into direct contact with the receiver substrate 20.

In one embodiment, an additional electrically insulating layer, preferentially made from silicon oxide, can be formed on the donor substrate 10 and/or on the receiver substrate 20, before the assembling step. Advantageously, the additional layer is formed on the receiver substrate 20 so as not to disrupt the quality of the layers already produced on the donor substrate 10. The additional layer is thus interposed between the receiver substrate 20 and the donor substrate 10 (cf. for example, the final substrate obtained and illustrated in FIG. 4). This layer makes it possible to improve the quality of the assembly by molecular adhesion, in particular, if one of the surfaces brought into contact comprises polycrystalline silicon. The substrate thus formed will be similar to and will have the advantages of a double SOI. It will also make it possible to electrically insulate the receiver substrate 20 from the influences of the potentials applied in the active layer 13 and in the filling layer 40. It thus offers the possibility, for the receiver substrate 20, of itself carrying integrated circuits or a functional layer (layer 61 of FIG. 4). For example, a doped, preferentially epitaxially grown, semiconductive layer that allows the co-integration of additional components on a bulk substrate (receiver substrate 20), such as integrated memories (Embedded DRAM).

The process also comprises a step e) of removing the carrier substrate 11 after step d), while preserving the active layer 13 and the sacrificial layer 12 to obtain the advanced substrate 1 (cf. FIGS. 1F and 1F'). This removal can be carried out by any conventional technique known to those skilled in the art that is compatible with the processes used in the microelectronics field. By way of example, this removal can be carried out by abrasion or else by chemical etching, or preferentially by introduction of a weakened zone followed by fracturing.

The process according to the present disclosure is easy to implement and advantageously allows the formation of a "monolithic" substrate, which has a buried electrically insulating layer comprising at least two zones having different thicknesses, while at the same time guaranteeing a match of the electrical behavior between the zones having different thicknesses of the buried oxide layer. Indeed, by virtue of the formation of a cavity in the oxide layer, which has been filled with polycrystalline silicon before assembling the donor and receiver substrates, the advanced substrate obtained benefits from uniformity of the thicknesses of the various portions of the layers, optimal roughness and an abrupt transition between the various portions of the layers having different thicknesses. These characteristics thus make possible a large-scale integration optimized for the production of components of different types on one and the same substrate, in particular, devices of FDSOI type and radiofrequency devices.

According to one embodiment, the process comprises a step of selectively etching the sacrificial layer 12 with respect to the active layer 13, the latter being preserved on the final advanced substrate 1.

The selective etching is preferentially wet chemical etching. By way of example, the selective etching of a silicon layer with respect to a sacrificial silicon-germanium layer may be carried out using a TMAH solution. Selective etching of a silicon-germanium layer with respect to a silicon layer may be carried out using an acetic acid solution.

The selective etching advantageously makes it possible to obtain, in the end, a desired active layer, the thickness and roughness of which are equivalent to the performance of an epitaxially grown substrate, which could not be the case if a single mechanical or chemical mechanical polishing was carried out.

Advantageously, the step of selectively etching the sacrificial layer 12 with respect to the active layer 13 is carried out just before the process for producing the components on the active layer 13. This is because the sacrificial layer 12 can also act as a passivation layer, thus avoiding the formation of a layer of native oxide on the active layer 13, and also protecting the latter during the substrate storage phase.

According to one embodiment, the process also comprises the following steps (cf. FIGS. 1A to 1E):
  b0) Forming, before step b) and after step a), a weakened zone 50 in the carrier substrate 11, the weakened zone 50 being substantially planar and located in the vicinity of the interface between the sacrificial layer 12 and the carrier substrate 11;
  e0) Fracturing the carrier substrate 11 along the weakened zone 50, after step d), and, preferentially, before the selective etching of the sacrificial layer 12 if it is carried out.

In other words, the removal of the carrier substrate 11 can be carried out by detachment and fracturing of the substrate. Thus, the carrier substrate is not entirely lost and it can advantageously be reused, in particular, in a further cycle of producing another advanced substrate according to the present disclosure.

The weakened zone 50 and the interface between the sacrificial layer 12 and the carrier substrate 11 delimit a residual layer 51 intended to be transferred onto the sacrificial layer 12 after the fracturing of the carrier substrate 11.

Preferentially, the materials of the sacrificial layer 12 and of the carrier substrate are chosen so that the residual layer can be selectively etched with respect to the sacrificial layer 12. As illustrated in FIGS. 1F and 1F', the process advantageously comprises selectively etching the residual layer 51 with respect to the sacrificial layer 12 after the fracturing step e0).

Advantageously, the filling layer 40 is formed by chemical vapor deposition at a temperature sufficiently low for it to be able to be carried out without having an impact on the weakened zone 50. Preferentially, the filling layer 40 is formed by chemical vapor deposition at a temperature between 150° C. and 250° C.

According to one embodiment, the weakened zone 50 can be obtained by implantation of at least one type of species selected from the following group: Hydrogen and Helium. The weakening implantation can also be carried out with several species implanted sequentially. Preferentially, the carrier substrate 11 is silicon based.

The conditions for creating the weakened zone 50 (species implanted, implantation energy and dose) and for fracturing depend on the thicknesses of the layers 12 and 13. Moreover, those skilled in the art will know how to adjust these conditions so as to form a weakened zone 50 in the carrier substrate 11. Moreover, the fracturing step e0) is preferentially carried out by heat treatment at a temperature that may be between 350 and 500° C.

The linking together of the steps of the process according to the present disclosure advantageously makes it possible to form a weakened zone before the structuring of the buried oxide layer by forming a cavity and then filling it with a semiconductive material. Thus, a substantially planar weakened zone can be easily and conventionally obtained, thus facilitating the fracturing and the detachment. In addition, the depositing of the filling material can be advantageously carried out at low temperatures in order to avoid premature fracturing and/or a detrimental modification of the carrier substrate before the assembling of the donor and receiver substrates.

Although all the steps of the process according to the present disclosure can been carried out at temperatures not exceeding 500° C., uniform layers having a surface roughness and surface characteristics that are optimal, in particular, compatible with a process for producing components of FDSOI type, are advantageously obtained. The process according to the present disclosure also makes it possible to dispense with the high-temperature finishing steps and to advantageously prevent recrystallization of the polycrystalline silicon layer. As a result, the polycrystalline silicon layer can act as a functional layer, such as a trapping layer (Trap Rich layer) within the final advanced substrate. Finally, the use of such a reduced temperature range would, according to one particular embodiment of the present disclosure, enable the transfer of the donor substrate formed onto a "structured" receiver substrate, comprising functional devices, in the context of a transfer of three-dimensional layers.

According to one embodiment, the active layer 13 preserved after step e) is locally thinned so as to locally reduce the thickness of the active layer 13. An advanced substrate that has an active layer that has portions with various thicknesses and a buried oxide layer that also has portions with various thicknesses is thus advantageously obtained. The advanced substrate can thus be configured to efficiently produce components having various functionalities.

Figure 2:
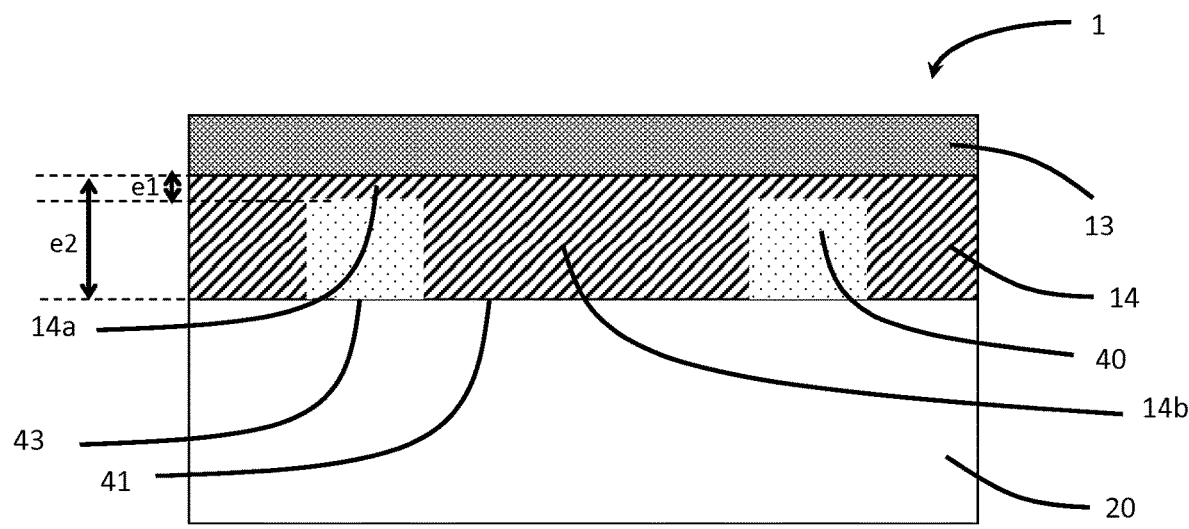
FIGS. 2 to 4 represent schematic sectional views of advanced substrates according to various embodiments.

Moreover, the needs previously set out may be satisfied while at the same time avoiding the abovementioned drawbacks, by also providing an advanced substrate 1 comprising (cf. FIGS. 2 and 3):
  A receiver substrate 20;
  An active layer 13 made from single-crystal semiconductor material; and
  An electrically insulating silicon oxide layer 14 interposed between the active layer 13 and the receiver substrate 20.

The substrate also comprises a polycrystalline silicon layer 40 placed on the receiver substrate 20. The polycrystalline silicon layer 40 is coated with the electrically insulating layer 14 so as to define a first portion 14a and a second portion 14b of the electrically insulating layer 14. The first portion 14a has a first thickness e1 and is interposed between the polycrystalline silicon layer 40 and the active layer 13. The second portion 14b of the electrically insulating layer 14 has a second thickness e2 greater than the first thickness e1. The second portion 14b is between the receiver substrate 20 and the active layer 13. Preferentially, the active layer 13 is surmounted by a sacrificial layer 12 that can be selectively etched with respect to the active layer 13, just before the production of the components in the active layer. In other words, the sacrificial layer also acts as a protective layer for the advanced substrate 1.

Figure 3:
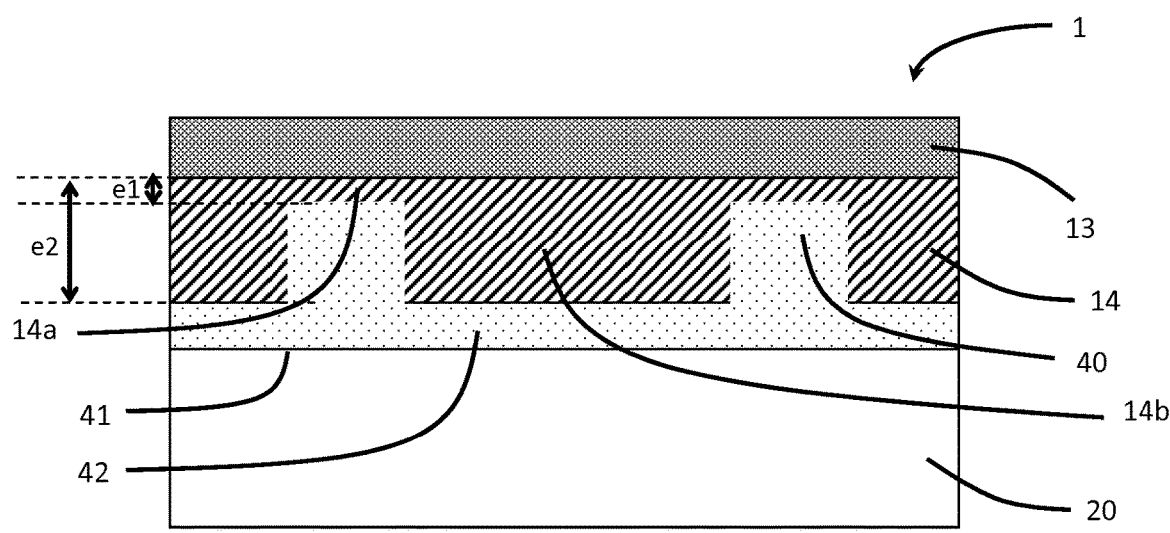

According to one embodiment, illustrated in FIG. 3, the advanced substrate comprises an additional layer 42 made from polycrystalline silicon, interposed between the receiver substrate 20 and the assembly formed by the electrically insulating layer 14 and the polycrystalline silicon layer 40.

Figure 4:
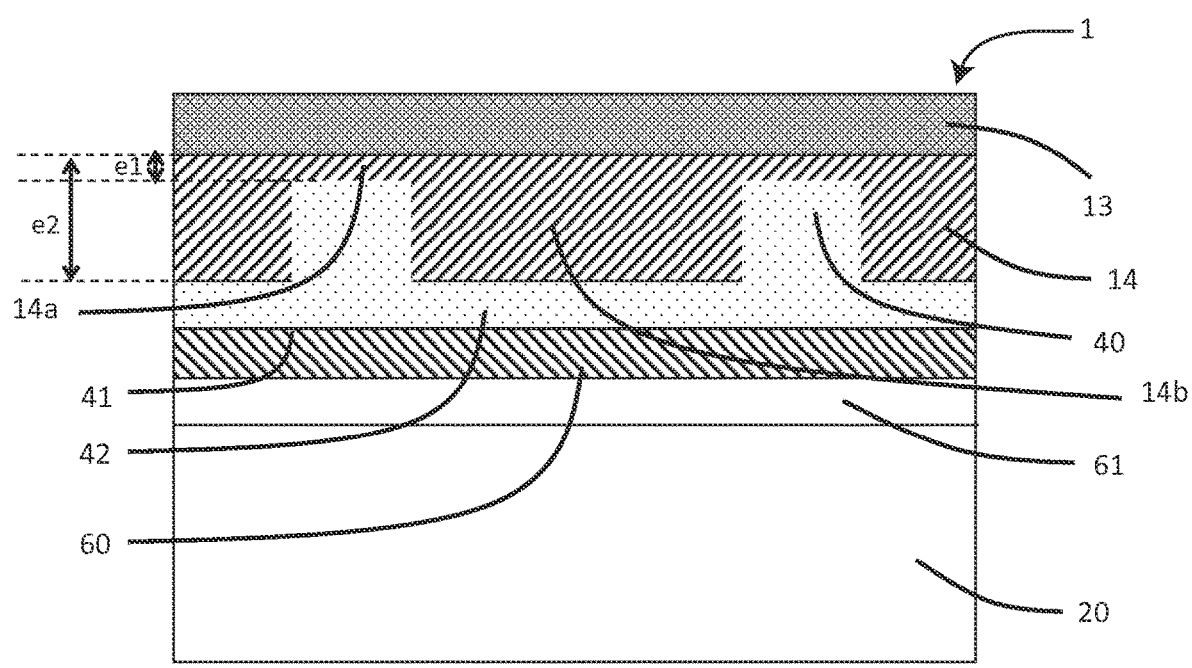

According to another embodiment, illustrated in FIG. 4, the advanced substrate 1 comprises, under the layer 42, a second electrically insulating layer 60, for example, a silicon oxide layer placed on the receiver substrate 20. The receiver substrate 20 itself may comprise a functional layer 61, such as a doped epitaxially grown layer, or else may comprise microelectronic devices such as integrated circuits, in the context of a 3D approach.

The invention claimed is:

1. A method of producing a substrate, comprising the following steps:
   a) providing a receiver substrate and a donor substrate comprising:
      a carrier substrate;
      an active layer made from a single-crystal semiconductor material; and
      a sacrificial layer made from a material that can be selectively etched with respect to the active layer, the sacrificial layer being interposed between the carrier substrate and the active layer;
      a silicon oxide layer with a free surface and arranged so that the active layer is interposed between the sacrificial layer and the oxide layer;
   b) forming a cavity in the oxide layer, the cavity having an opening that lies flush with the free surface so that the oxide layer comprises a first portion having a first thickness and placed between the cavity and the active layer, and a second portion having a second thickness greater than the first thickness, the second portion being placed between the free surface and the active layer;
   c) forming a polycrystalline silicon filling layer so as to completely fill the cavity and form a continuous and substantially planar second free surface, the second free surface comprising at least one first polycrystalline silicon surface;
   d) assembling the receiver substrate and the donor substrate on the second free surface; and
   e) removing the carrier substrate after step d) while preserving the active layer and the sacrificial layer.

2. The method of claim 1, further comprising, after step e), a step of selectively etching the sacrificial layer while at the same time preserving the active layer.

3. The method of claim 2, wherein the assembling step d) comprises a step of bonding by molecular adhesion.

4. The method of claim 1, further comprising the following steps:
   b0) forming, before step b) and after step a), a weakened zone in the carrier substrate, the weakened zone being substantially planar and located in the vicinity of the interface between the sacrificial layer and the carrier substrate; and
   e0) fracturing the carrier substrate along the weakened zone after step d).

5. The method of claim 4, wherein the carrier substrate comprises a material that can be selectively etched with respect to the material of the sacrificial layer, the method further comprising selectively etching the rest of the carrier substrate placed on the sacrificial layer, after the fracturing step e0).

6. The method of claim 4, wherein the filling layer is formed by chemical vapor deposition at a temperature between 150° C. and 250° C.

7. The method of claim 1, wherein the single-crystal silicon active layer is produced by epitaxy.

8. The method of claim 1, wherein the filling layer covers the silicon oxide layer.

9. The method of claim 8, wherein a polycrystalline silicon layer is formed on the second portion of the silicon oxide layer, the polycrystalline silicon layer having a thickness of between 1 nm and 1000 nm, and wherein the second free surface formed following step c) consists essentially of polycrystalline silicon.

10. The method of claim 1, wherein step c) comprises thinning of filling layer and/or the oxide layer so that the second free surface also comprises a second silicon oxide surface.

11. The method of claim 1, wherein the active layer preserved after step e) is locally thinned to locally reduce the thickness of the active layer.

12. The method of claim 1, wherein the assembling step d) comprises a step of bonding by molecular adhesion.

\* \* \* \* \*